(12) United States Patent
Lohokare et al.

(10) Patent No.: US 7,413,673 B2
(45) Date of Patent: Aug. 19, 2008

(54) METHOD FOR ADJUSTING VOLTAGE ON A POWERED FARADAY SHIELD

(75) Inventors: Shrikant P. Lohokare, Fremont, CA (US); Andras Kuthi, Thousand Oaks, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 347 days.

(21) Appl. No.: 11/109,921

(22) Filed: Apr. 19, 2005

(65) Prior Publication Data

US 2005/0194355 A1    Sep. 8, 2005

Related U.S. Application Data

(62) Division of application No. 10/210,239, filed on Jul. 31, 2002, now abandoned.

(51) Int. Cl.
*H03J 3/12* (2006.01)

(52) U.S. Cl. .......................... 216/61; 438/714; 438/729
(58) Field of Classification Search ....................... None
See application file for complete search history.

(56) References Cited

U.S. PATENT DOCUMENTS 6,422,173 B1 * 7/2002 Nakajima ................. 118/723 I

* cited by examiner

*Primary Examiner*—Allan Olsen
(74) *Attorney, Agent, or Firm*—Martine Penilla & Gencarella, LLP

(57) ABSTRACT

An apparatus and method for adjusting the voltage applied to a Faraday shield of an inductively coupled plasma etching apparatus is provided. An appropriate voltage is easily and variably applied to a Faraday shield such that sputtering of a plasma can be controlled to prevent and mitigate deposition of non-volatile reaction products that adversely affect an etching process. The appropriate voltage for a particular etching process or step is applied to the Faraday shield by simply adjusting a tuning capacitor. It is not necessary to mechanically reconfigure the etching apparatus to adjust the Faraday shield voltage.

13 Claims, 13 Drawing Sheets

METHOD FOR ADJUSTING VOLTAGE ON A POWERED FARADAY SHIELD

CROSS-REFERENCE TO RELATED APPLICATIONS

This application is a divisional of U.S. application Ser. No. 10/210,239, filed on Jul. 31, 2002, now abandoned the disclosure of which is incorporated herein by reference.

BACKGROUND OF THE INVENTION

1. Field of the Invention

The present invention relates generally to semiconductor fabrication, and more particularly, to apparatuses and methods for adjusting the voltage on a powered Faraday shield to control the behavior of a plasma inside an inductively coupled plasma etching chamber.

2. Description of the Related Art

In semiconductor manufacturing, etching processes are commonly and repeatedly carried out. As is well known to those skilled in the art, there are two types of etching processes: wet etching and dry etching. Dry etching is typically performed using an inductively coupled plasma etching apparatus.

FIG. 1 shows an inductively coupled plasma etching apparatus 100, in accordance with the prior art. The inductively coupled plasma etching apparatus 100 includes an etching chamber 101 structurally defined by chamber walls 102 and a chamber window 104. The chamber walls 102 are typically fabricated from stainless steel; however, other suitable materials may also be used. The chamber window 104 is typically fabricated from quartz; however, other materials such as alumina ($Al_2O_3$), silicon nitride ($Si_3N_4$), aluminum nitride (AlN), silicon carbide (SiC), and silicon (Si) may also be used. The chamber window 104 provides a vacuum seal to the chamber walls 102. A semiconductor wafer (i.e., "wafer") 110 is mounted on a chuck 108 positioned on the bottom inner surface of the etching chamber 101. A coil 116 and a metal shield 112 are positioned above the chamber window 104. The coil 116 is held above the etching chamber 101 by insulating spacers (not shown). The coil 116 is fabricated from an electrically conductive material and includes at least one complete turn. The exemplary coil 116 shown in FIG. 1 includes three turns. The coil 116 symbols having an "X" indicate that the coil 116 extends rotationally into the page. Conversely, the coil 116 symbols having a "●" indicate that the coil 116 extends rotationally out of the page. The metal shield 112 is secured beneath the coil 116 in a spaced apart relationship using insulating spacers 114. The metal shield 112 is disposed immediately above the chamber window 104. The coil 116, the metal shield 112, and the chamber window 104 are each configured to be substantially parallel to one another. Furthermore, the coil 116 and the metal shield 112 are electrically connected through a tap 118.

FIG. 2 shows the basic operating principles of the inductively coupled plasma etching apparatus 100, in accordance with the prior art. During operation, a reactant gas flows through the etching chamber 101 from a gas lead-in port (not shown) to a gas exhaust port (not shown). High frequency power (i.e., RF power) is then applied from a power supply (not shown) to the coil 116 to cause an RF current to flow through the coil 116. The RF current flowing through the coil 116 generates an electromagnetic field 120 about the coil 116. The electromagnetic field 120 generates an inductive current 122 within the etching chamber 101. The inductive current 122 acts on the reactant gas to generate a plasma 123. High frequency power (i.e., RF power) is applied from a power supply (not shown) to the chuck 108 to provide directionality to the plasma 123 such that the plasma 123 is "pulled" down onto the wafer 110 surface to effect the etching process.

The plasma 123 contains various types of radicals in the form of positive and negative ions. The chemical reactions of the various types of positive and negative ions are used to etch the wafer 110. During the etching process, the coil 116 performs a function analogous to that of a primary coil in a transformer, while the plasma 123 performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber 101. The non-volatile reaction products may adhere to the chamber walls 101 and the chamber window 104. Adherence of non-volatile reaction products to the chamber window 104 may interfere with the etching process. A deposition of electrically conductive non-volatile reaction products on the chamber window 104 may electrically shield the inner region of the etching chamber 101 from the electromagnetic field 120 generated about the coil 116. Consequently, the plasma 123 will not strike well, and the etching process will have to be discontinued until the deposition is removed from the chamber window 104. Additionally, excessive deposition may result in particles flaking off the chamber window 104 onto the wafer 110, thus interfering with the etching process. Excessive deposition, therefore, requires more frequent cleanings of the etching chamber 101 and the chamber window 104.

Deposition of non-volatile reaction products on the chamber window 104 can be mitigated and prevented by sputtering the plasma against the chamber window 104 to "knock off" the deposition. To avoid non-uniformity in the plasma 123, the sputtering should be performed in a uniform manner across the chamber window 104. Non-uniform deposition and/or non-uniform sputter can introduce drift into the etching process. Drift can prevent reproducibility among a number wafers 110 whose characteristics are intended to be uniform.

The metal shield 112 acts as a Faraday shield to ensure that electromagnetic energy generated by the coil 116 is uniformly distributed to the plasma 123. As a result of uniformly distributing the electromagnetic energy to the plasma 123 in the vicinity of the chamber window 104, the deposition of non-volatile reaction products onto the chamber window 104 will occur uniformly. Similarly, the sputtering of non-volatile reaction products from the chamber window 104 will also occur uniformly. The presence of uniform electrical characteristics across the chamber window 104 facilitates the generation of uniform plasma 123 characteristics across the etching chamber 101. However, even uniform deposition of non-volatile reaction products on the chamber window 104 will continue to interfere with the etching process as previously discussed. Therefore, it is necessary to sputter the plasma 123 against the chamber window 104 to prevent buildup of non-volatile reaction product deposition. The sputtering of plasma 123 against the chamber window 104 must be performed carefully to minimize or prevent erosion of the chamber window 104 by the charged particles of the plasma 123.

FIG. 3 shows how the Faraday shield voltage can be controlled to affect the chamber window 104 characteristics, in accordance with the prior art. View 134 shows the effects of applying an appropriate voltage to the metal shield 112 to control deposition and sputter of non-volatile reaction products relative to the chamber window 104. With the appropriate voltage applied to the metal shield 112, incident ions 128 of the plasma 123 will be uniformly directed toward the chamber window 104. The energy and intensity of the incident ions 128 will prevent deposition while simultaneously minimizing the erosive effects of sputtering. View 136 shows the effects of applying too low a voltage to the metal shield 112. With too low a voltage, incident ions 130 directed toward the chamber window 104 will lack the required energy and intensity to prevent buildup of non-volatile reaction products commonly called a deposition 124. View 138 shows the effects of applying too high a voltage to the metal shield 112. With too high a voltage, incident ions 132 will be directed toward the chamber window 104 having too much energy and too much intensity, thus causing too much sputtering. Excessive sputtering can result in erosion 126 of the chamber window 104. Such erosion 126 not only shortens the lifetime of the chamber window 104, but also generates particles which can contaminate the wafer 110 and introduce unwanted chemical species into the etching process environment. The presence of unwanted species in the etching process environment is particularly undesirable because it leads to poor reproducibility of the etching process conditions.

The appropriate Faraday shield voltage is dependent on the particular etching process that is being performed. Some factors that may influence the appropriate voltage include the type of reactant gas, the RF power applied to the coil 116, the material to be etched from the wafer 110, and the process environment conditions inside the etching chamber 101. Many etching recipes include multiple etching steps, e.g., the breakthrough step, the bulk etch steps, and the over etch step, in which the RF power, pressure, and gas compositions can be substantially different. Consequently, a certain setting for the appropriate Faraday shield voltage for a given etch step may not be optimal in other etch steps. Thus, the Faraday shield voltage should be controllable to ensure that the chamber window 104 is maintained free of non-volatile reaction product deposition during the etching process. Furthermore, the Faraday shield voltage should be easily adjustable to accommodate the variance in voltage requirements for different etching processes and steps. In the prior art, the etching apparatus has been mechanically reconfigured to obtain an appropriate Faraday shield voltage for a particular etching process. Such mechanical reconfiguration has a narrow operating window and is costly in terms of material expense and time resulting in lower wafer throughput.

In view of the foregoing, there is a need for an apparatus and a method to easily adjust the voltage applied to a Faraday shield of an inductively coupled plasma etching apparatus.

SUMMARY OF THE INVENTION

Broadly speaking, the present invention fills these needs by providing an apparatus and method to easily adjust the voltage on a Faraday shield of an inductively coupled plasma etching apparatus. The Faraday shield voltage adjustment provides control of plasma sputtering against a chamber window to prevent and mitigate deposition of non-volatile reaction products. It should be appreciated that the present invention can be implemented in numerous ways, including as a process, an apparatus, a system, a device, or a method. Several embodiments of the present invention are described below.

In one embodiment, an inductively coupled plasma etching apparatus is disclosed. The etching apparatus includes a chamber with a window for sealing a top opening of the chamber. The window has an inner surface exposed to an internal region of the chamber. The etching apparatus also includes a metal shield disposed above and spaced apart from the window. A coil is disposed above and spaced apart from the metal shield. The coil has an input terminal, an output terminal, and a length. The coil is electrically connected to the metal shield by an electrically conductive tap. Furthermore, control circuitry is in electrical communication with the input terminal and the output terminal of the coil. The control circuitry is configured to supply RF power to the input terminal of the coil. The control circuitry also includes a capacitor in electrical communication with the output terminal of the coil. The capacitor is configured to be tuned to control a voltage on the metal shield. The voltage on the metal shield is controlled over a range extending between a near zero voltage level and an upper voltage level. The selected process voltage for a particular etching process to be performed lies within the range over which the metal shield voltage is controlled.

In another embodiment, a method for adjusting voltage on a Faraday shield of an inductively coupled plasma etching apparatus is disclosed. The method includes fixing a capacitance of a tuning capacitor to near its zero operating capacitance, wherein the tuning capacitor is connected to a coil of the inductively coupled plasma etching apparatus. The method further includes determining a location of a node on the coil, wherein the node corresponds to the node of a standing RF wave existing on the coil. The node location is determined when the tuning capacitor is fixed near its zero operating capacitance. The method further includes electrically connecting the coil to a metal shield at a connection location substantially close to the location of the node. The method also includes adjusting the tuning capacitor to obtain a voltage on the metal shield that is appropriate for an etching process.

In another embodiment, a method for performing an inductively coupled plasma etching process is disclosed. The method is based on performing the inductively coupled plasma etching process in a chamber configured for etching a wafer. The chamber includes a window on a top opening. The window has an outer surface and an inner surface that is exposed to an inner region of the chamber. Both a coil and a metal shield are positioned over the outer surface of the window. The metal shield is positioned in a spaced apart relationship between the coil and the outer surface of the window. The method includes fixing a capacitance of a tuning capacitor to near its zero operating capacitance, wherein the tuning capacitor is connected to the coil. The method also includes determining a location of a node on the coil. The node corresponds to the node of a standing RF wave existing on the coil when the tuning capacitor is fixed near its zero operating capacitance. The method further includes electrically connecting the coil to the metal shield at a connection location substantially close to the location of the node. According to the method, the tuning capacitor is adjusted to obtain a voltage on the metal shield that is appropriate for an etching process. The method also includes performing the etching process.

The advantages of the present invention are numerous. Most notably, the apparatus and method for adjusting the Faraday shield voltage of the inductively coupled plasma etching apparatus as disclosed in the present invention avoids the problems of the prior art by providing control of the plasma sputter against the etching chamber window. Control of the plasma sputter allows for prevention and mitigation of non-volatile reaction product deposition on the chamber window.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an apparatus and method for adjusting the voltage applied to a Faraday shield of an inductively coupled plasma etching apparatus. Broadly speaking, the present invention allows an appropriate voltage to be easily and variably applied to a Faraday shield such that sputtering of a plasma can be controlled to prevent and mitigate deposition of non-volatile reaction products that adversely affect an etching process. The appropriate voltage for a particular etching process or step can be applied to the Faraday shield by simply adjusting a tuning capacitor. Thus, the present invention eliminates the need to mechanically reconfigure the etching apparatus to obtain an appropriate Faraday shield voltage for a particular etching process or step.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
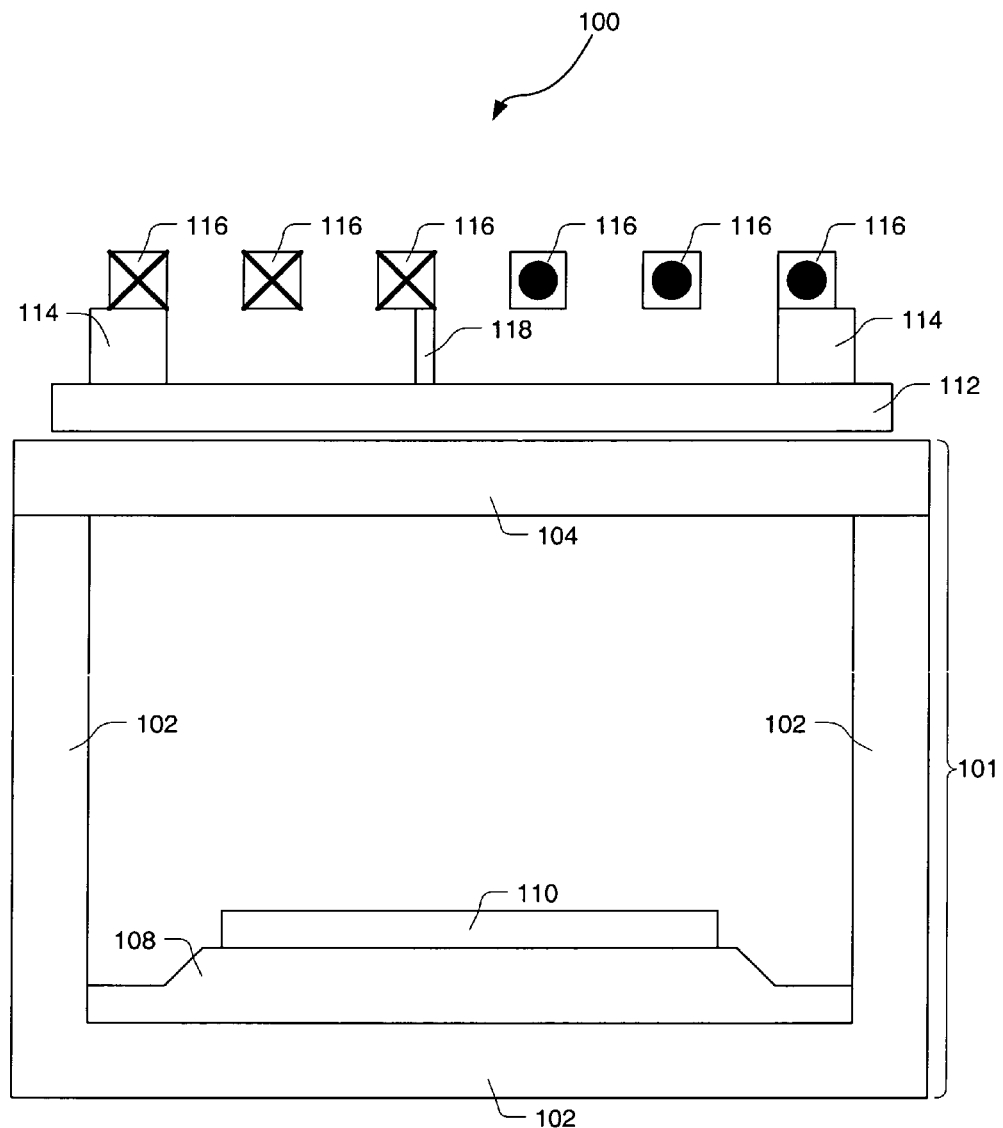
FIG. 1 is an illustration showing an inductively coupled plasma etching apparatus, in accordance with the prior art.
Figure 2:
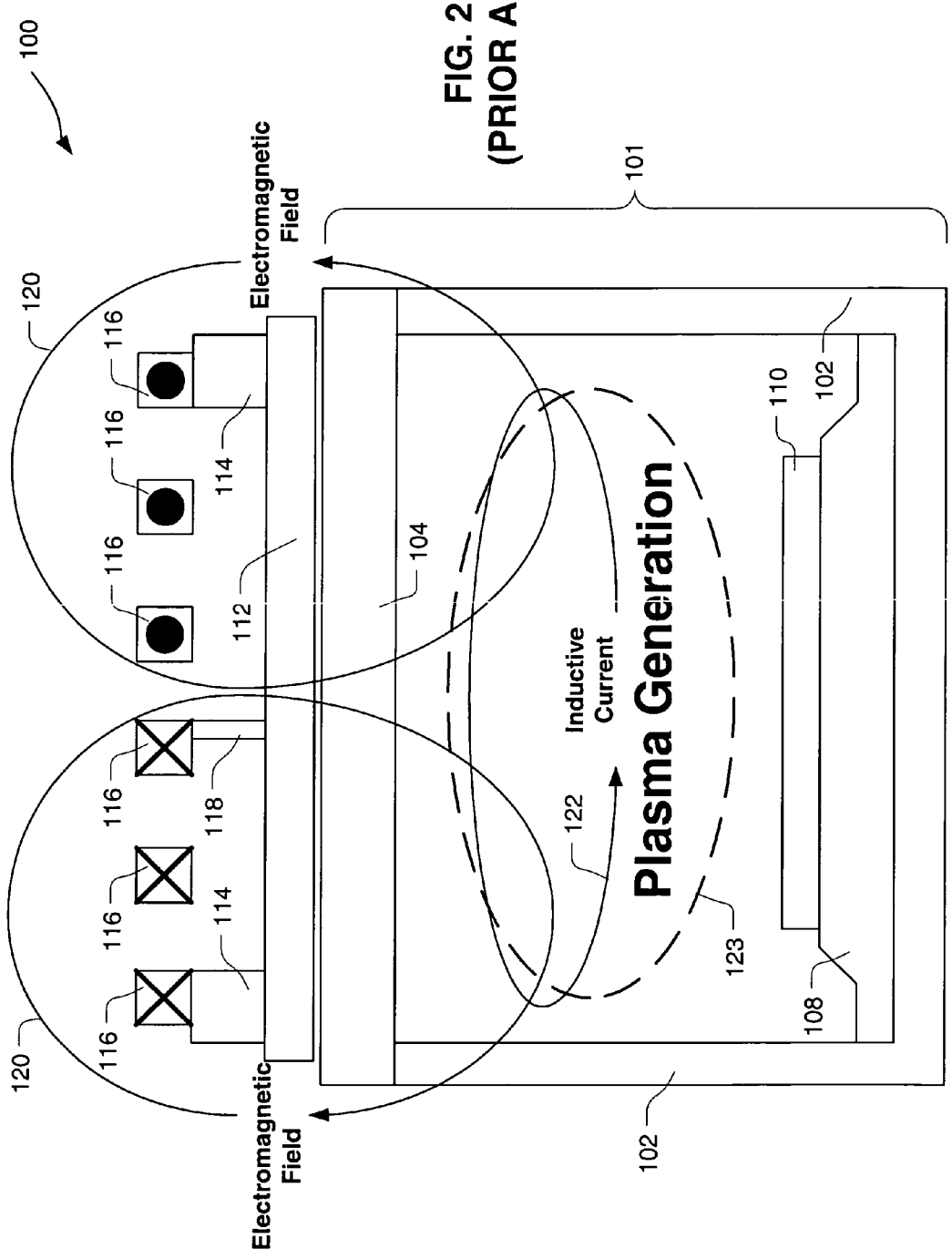
FIG. 2 is an illustration showing the basic operating principles of the inductively coupled plasma etching apparatus, in accordance with the prior art.
Figure 3:
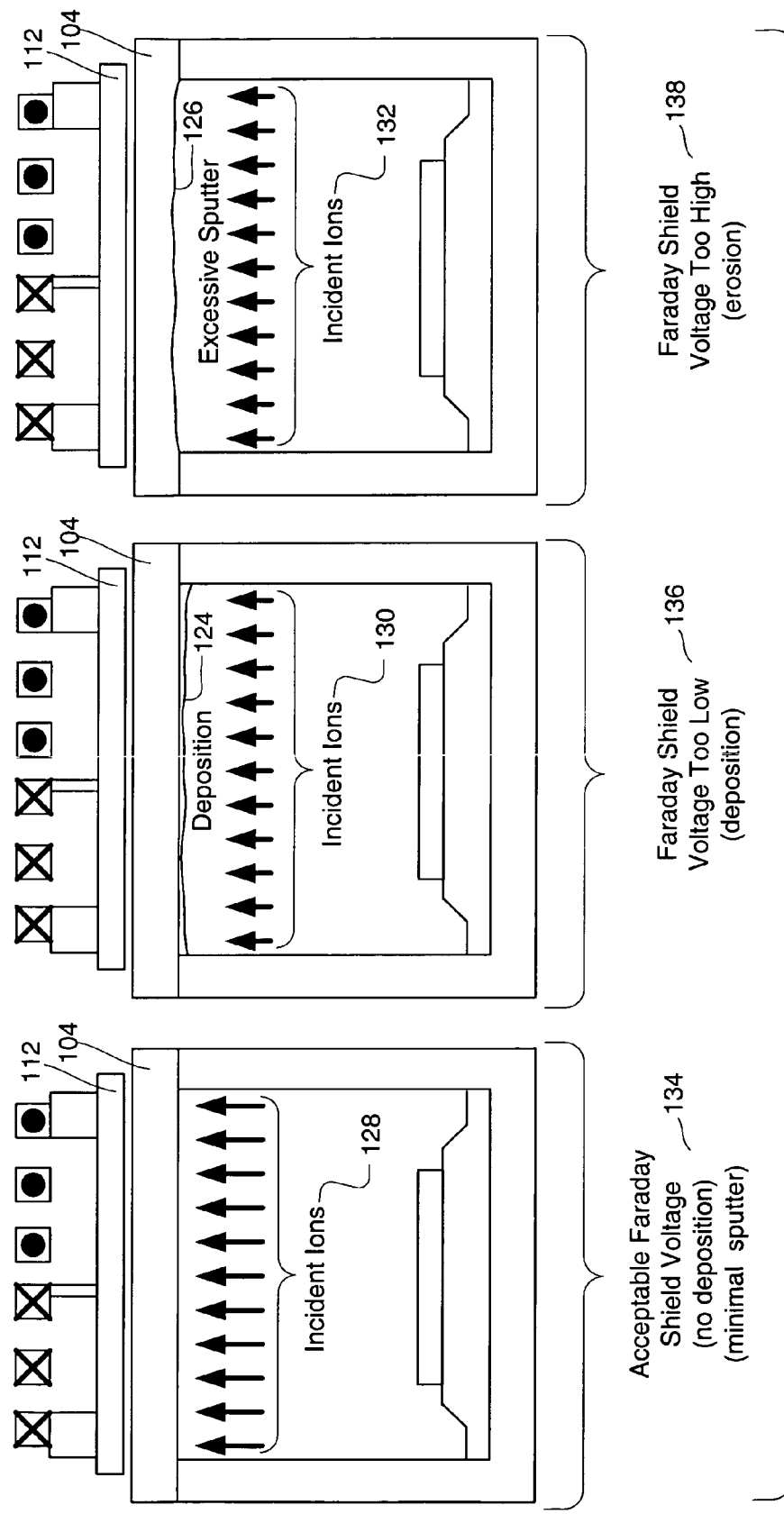
FIG. 3 is an illustration showing how the Faraday shield voltage can be controlled to affect the chamber window characteristics, in accordance with the prior art.
Figure 4:
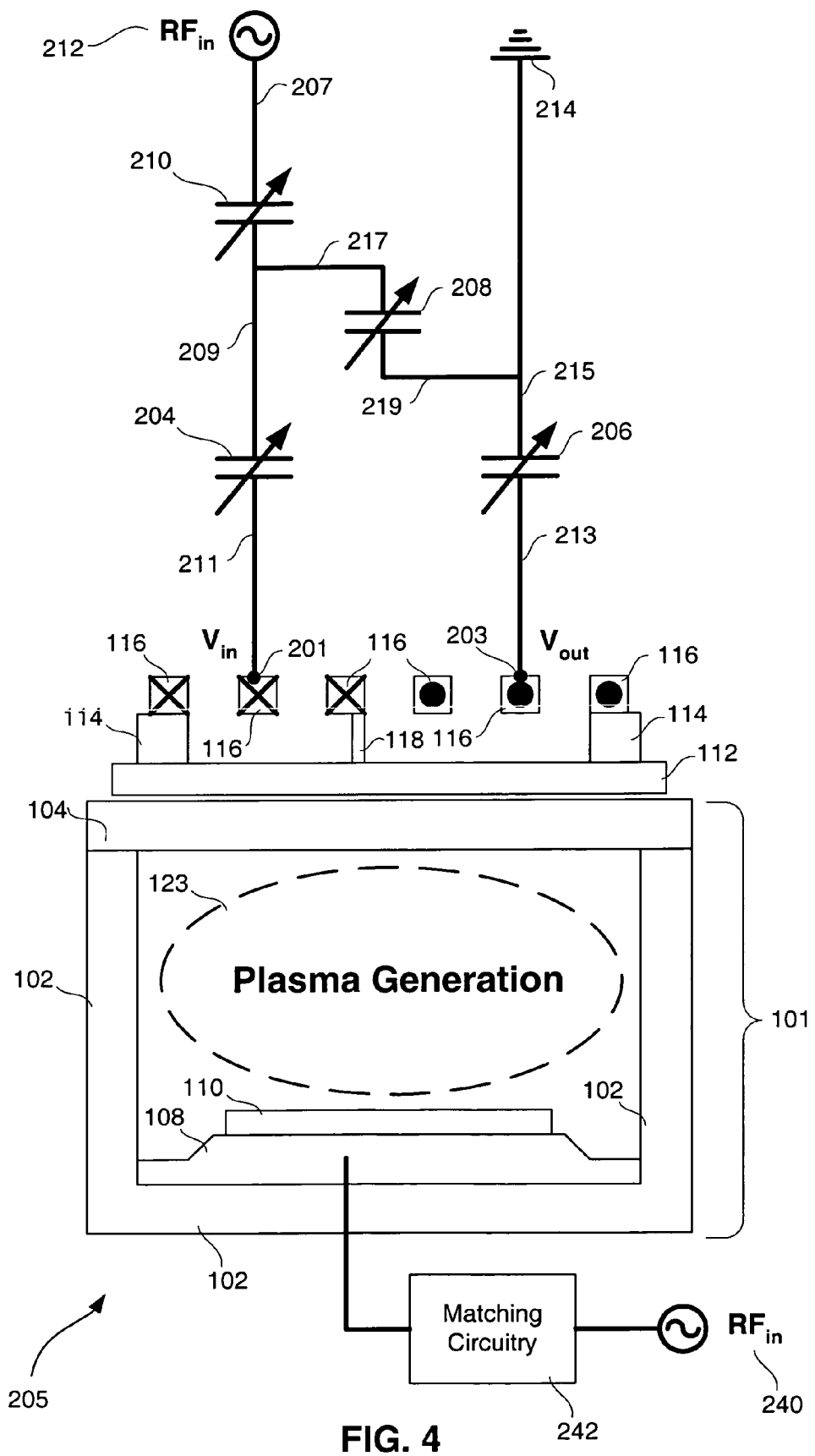
FIG. 4 is an illustration showing an inductively coupled plasma etching apparatus, in accordance with one embodiment of the present invention.

FIG. 4 shows an inductively coupled plasma etching apparatus 205, in accordance with one embodiment of the present invention. The inductively coupled plasma etching apparatus 205 includes an etching chamber 101 structurally defined by chamber walls 102 and a chamber window 104. The chamber walls 102 are typically fabricated from stainless steel; however, other suitable materials may be used. The chamber window 104 is typically fabricated from quartz; however, other materials such as alumina ($Al_2O_3$), silicon nitride ($Si_3N_4$), aluminum nitride (AlN), silicon carbide (SiC), and silicon (Si) may also be used. The chamber window 104 provides a vacuum seal to the chamber walls 102. A semiconductor wafer (i.e., "wafer") 110 is mounted on a chuck 108 positioned on the bottom inner surface of the etching chamber 101. An RF power source 240 supplies power to the chuck 108 through matching circuitry 242. The RF power applied to the chuck 108 is used to provide directionality to the plasma 123 so that the plasma 123 will be directed onto the wafer 110.

With further respect to FIG. 4, a coil 116 and a metal shield (or "Faraday shield") 112 are positioned above the chamber window 104. The coil 116 is held above the etching chamber 101 by insulating spacers (not shown). The coil 116 is fabricated from an electrically conductive material and includes at least one complete turn. The exemplary coil 116 shown in FIG. 4 includes three turns. The coil 116 symbols having an "X" indicate that the coil 116 extends rotationally into the page. Conversely, the coil 116 symbols having a "●" indicate that the coil 116 extends rotationally out of the page. The Faraday shield 112 is secured beneath the coil 116 in a spaced apart relationship using insulating spacers 114.

The insulating spacers 114 shown in FIG. 4 represent one exemplary configuration. Another configuration can have the insulating spacers 114 extending both radially and inward to fill the space between the coil 116 and the Faraday shield 112. Such an extensive insulating spacer 114 configuration could be used to prevent an electrical voltage breakdown (e.g., electric arc) between the coil 116 and the Faraday shield 112. In another configuration, the insulating spacers 114 may completely enclose the Faraday shield 112 edge. In this configuration, a region near the Faraday shield 112 edge between the chamber window 104 outer surface and the Faraday shield 112 can be occupied by the insulating spacers 114. The use of a particular insulating spacer 114 configuration depends on the spacing between the coil 116 and Faraday shield 112.

The Faraday shield 112 is disposed immediately above the chamber window 104. Since the Faraday shield 112 is capacitively coupled to the chamber window 104, the Faraday shield 112 can either be in contact with the outer (i.e., top) surface of the chamber window 104 or elevated above the chamber window 104. Hence, the Faraday shield 112 may be resting on, bonded to, or supported above the chamber window 104. The exemplary embodiment of the present invention as shown in FIG. 4 depicts the Faraday shield 112 supported above the chamber window 104. The coil 116, the Faraday shield 112, and the chamber window 104 are each configured to be substantially parallel to one another. Furthermore, the coil 116 and the Faraday shield 112 are electrically connected through a tap 118.

An RF power source 212 supplies power to the coil 116. The RF power source 212 is in electrical communication with a capacitor 210 through a connection 207. The capacitor 210 is in further electrical communication with a capacitor 204 through a connection 209. The capacitor 204 is in further electrical communication with an input terminal 201 of the coil 116 through a connection 211. A voltage $V_{in}$ is supplied from capacitor 204 to input terminal 201. Complementary to input terminal 201, the coil also has an output terminal 203. The output terminal 203 of the coil 116 is in electrical communication with a capacitor 206 through a connection 213. A voltage $V_{out}$ is supplied from the output terminal 203 to the capacitor 206. The capacitor 206 is in further electrical communication with a ground 214 through a connection 215. A capacitor 208 is in electrical communication with the capacitor 210 and the capacitor 204 through a connection 217 which is electrically coupled to the connection 209. The capacitor 208 is in further electrical communication with the capacitor 206 and the ground 214 through a connection 219 which is electrically coupled to the connection 215.

During operation, a reactant gas flows through the etching chamber 101 from a gas lead-in port (not shown) to a gas exhaust port (not shown). High frequency power (i.e., RF power) is then applied from a power supply (not shown) to the coil 116 to cause an RF current to flow through the coil 116. The RF current flowing through the coil 116 generates an electromagnetic field about the coil 116. The electromagnetic field generates an inductive current within the etching chamber 101. The inductive current acts on the reactant gas to generate a plasma 123. The plasma 123 is enveloped by a sheath of non-plasma reactant gas. Therefore, high frequency power (i.e., RF power) is applied from a power supply 240 through matching circuitry 242 to the chuck 108 to provide directionality to the plasma 123 such that the plasma 123 is "pulled" down onto the wafer 110 surface to effect the etching process.

The plasma 123 contains various types of radicals in the form of positive and negative ions. The chemical reactions of the various types of positive and negative ions are used to etch the wafer 110. During the etching process, the coil 116 performs a function analogous to that of a primary coil in a transformer, while the plasma 123 performs a function analogous to that of a secondary coil in the transformer.

Figure 5:
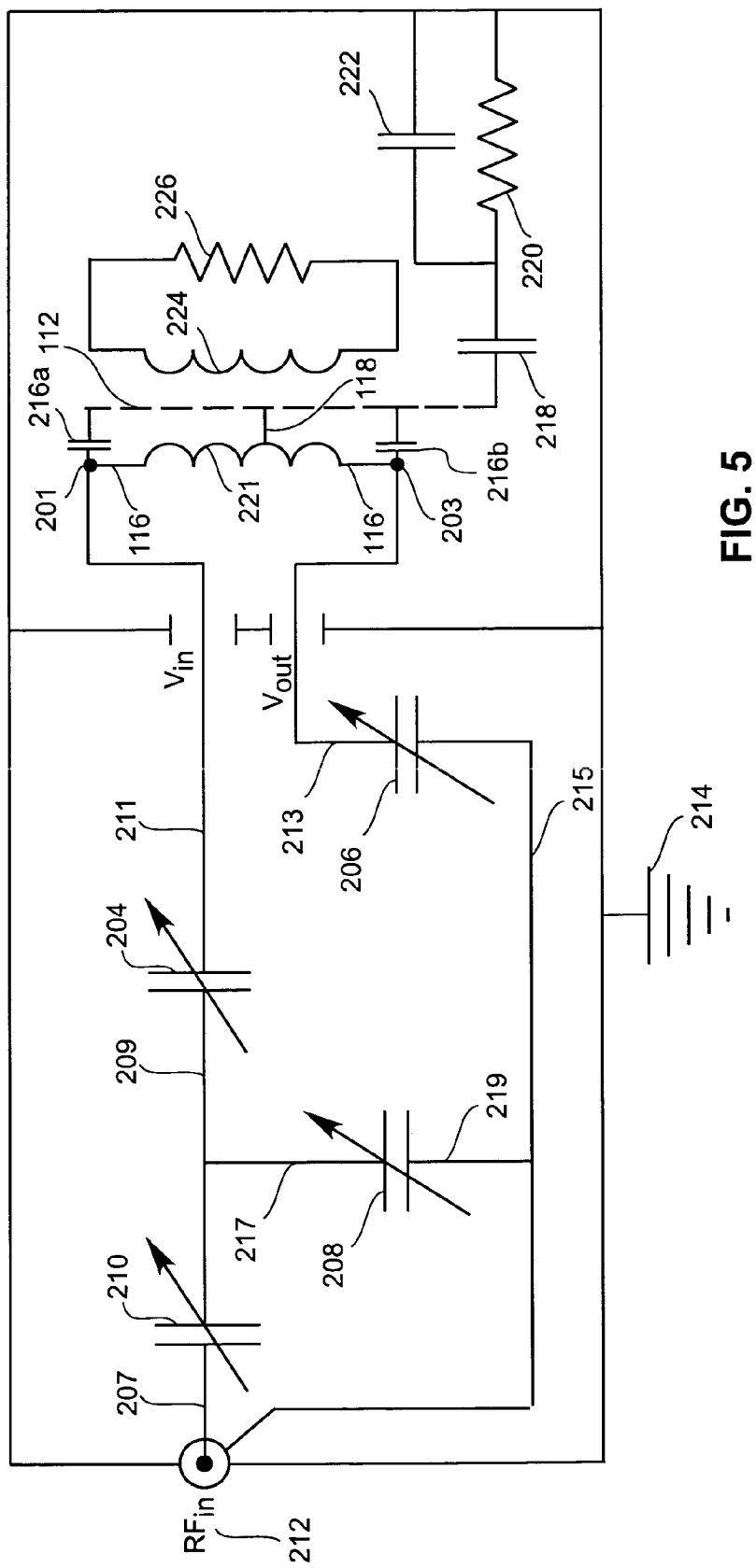
FIG. 5 is an illustration showing an electrical diagram of the inductively coupled plasma etching apparatus, in accordance with one embodiment of the present invention.

FIG. 5 shows an electrical diagram of the inductively coupled plasma etching apparatus 205, in accordance with one embodiment of the present invention. The electrical components and connections between the RF power source 212, the ground 214, the coil 116 input terminal 201, and the coil 116 output terminal 203 are identical to those previously described with respect to FIG. 4. The electrical relationship of the physical components of the inductively coupled plasma etching apparatus 205 are shown in the remainder of FIG. 5.

The coil 116 is shown as being electrically connected to the Faraday shield 112 by the tap 118. The physical spacing between the coil 116 and the Faraday shield 112 results in a capacitive effect. Specifically, a capacitance 216a exists between the coil 116 and the Faraday shield 112 along the length of coil 116 between the input terminal 201 and the tap 118. Similarly, a capacitance 216b exists between the coil 116 and the Faraday shield 112 along the length of coil 116 between the tap 118 and the output terminal 203. The physical spacing between the Faraday shield 112 and the chamber window 104 also results in a capacitive effect as shown by a capacitor 218.

An electromagnetic field is generated by the coil 116 to induce a current within the reactant gas inside the etching chamber 101. The current induced within the reactant gas causes the plasma 123 to be created. The coil 116 and the plasma 123 are electrically coupled in a manner similar to that of a primary and secondary coil, respectively, of a transformer. Correspondingly, the coil 116 is shown as having an inductance 221, and the plasma 123 is shown as having an inductance 224. The plasma 123 is also shown as having a resistance 226 to the induced current. Additionally, the plasma 123 is surrounded by a sheath of reactant gas which effectively separates the charged plasma 123 from the chamber walls 102 which are connected to the ground 214. The sheath of reactant gas has a capacitance 222 and a resistance 220. The chuck 108 is sufficiently removed from the chamber window 104 such that its electrical properties do not influence the electrical behavior of the Faraday shield 112 and coil 116. Therefore, the electrical relationship of the chuck 108, with its matching circuitry 242 and RF power source 240, to the inductively coupled plasma etching apparatus 205 is not shown in FIG. 5.

An electrostatic field is generated by the Faraday shield 112 between the plasma 123 and the chamber window 104 inside the etching chamber 101. The electrostatic field generated by the Faraday shield 112 creates a voltage which causes ions within the plasma 123 to be accelerated toward the chamber window 104. This acceleration and resultant collision with the chamber window 104 is called sputtering. The sputtering causes non-volatile reaction products which have been deposited on the chamber window 104 to be "knocked off". Thus, properly controlled sputtering is effective at preventing and mitigating deposition of non-volatile reaction products on the chamber window 104.

The voltage applied to the Faraday shield 112 controls the electrostatic field generated by the Faraday shield 112. Control of the voltage applied to the Faraday shield 112 results in control of the plasma 123 sputtering against the chamber window 104. Thus, by carefully controlling the voltage applied to the Faraday shield 112, the plasma 123 sputtering against the chamber window 104 is carefully controlled to prevent deposition while simultaneously minimizing the erosive effects of sputtering. To further minimize the erosive effects of sputtering, alternate embodiments of the present invention may position a non-conductive sacrificial liner in the immediate vicinity of the chamber window 104 inner surface. To prevent deposition and minimize the erosive effects of sputtering, the present invention provides an apparatus and method for carefully controlling the voltage applied to the Faraday shield 112.

Figure 6:
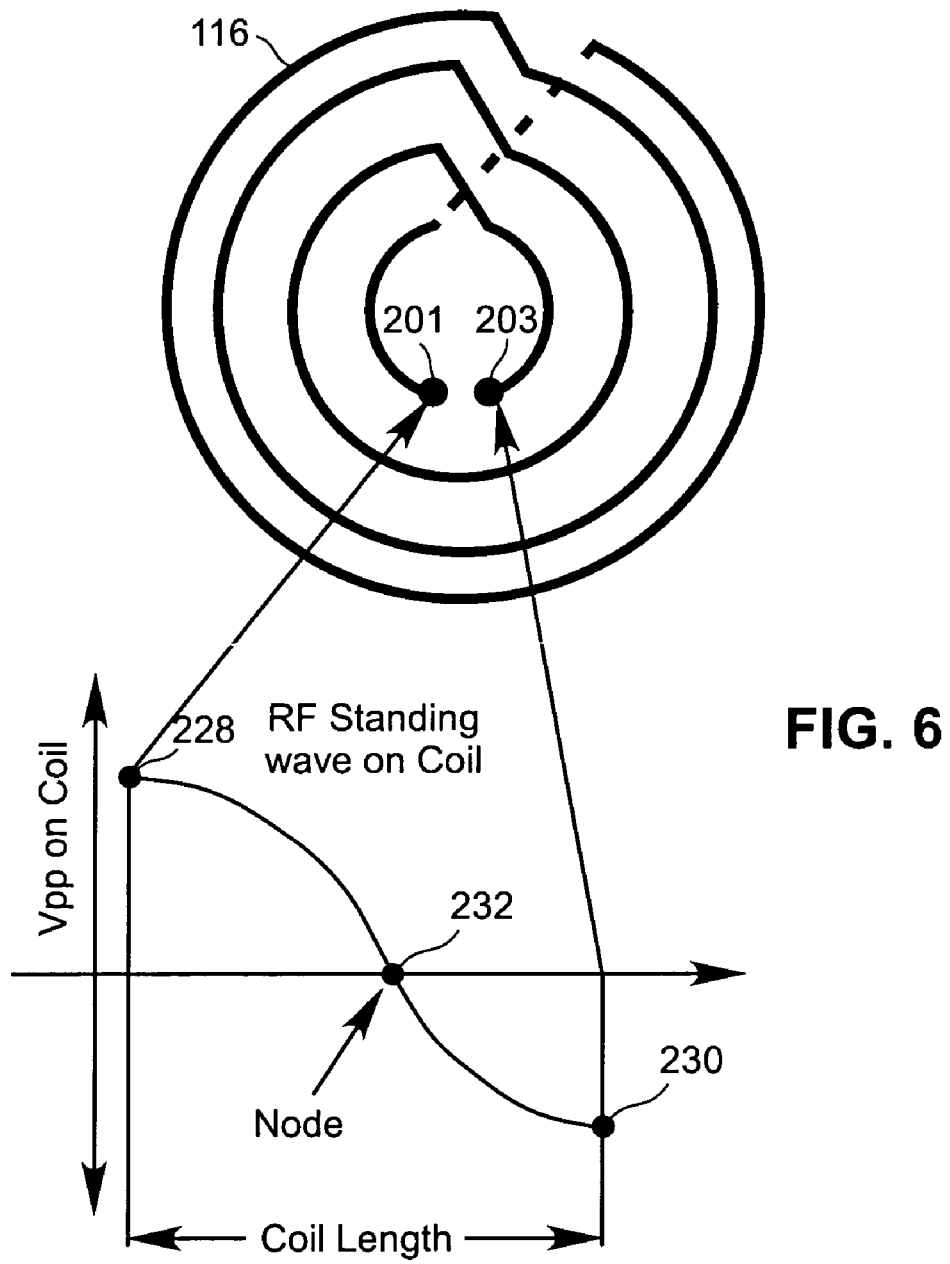
FIG. 6 is an illustration showing a standing RF wave present on the coil, in accordance with one embodiment of the present invention.

FIG. 6 shows a standing RF wave present on the coil 116, in accordance with one embodiment of the present invention. The coil 116 input terminal 201 is shown as corresponding to a positive peak amplitude 228 of the standing RF wave. Conversely, the coil 116 output terminal 203 is shown as corresponding to a negative peak amplitude 230 of the standing RF wave. Thus, a node 232 exists along the length of the coil 116. At the location of the node 232 the corresponding coil 116 voltage is substantially close to zero. With a sufficiently long coil 116 it is possible to have more than one node 232, where the spacing between nodes 232 is dependent on the RF frequency. Though the exemplary embodiment of the present invention shows a coil 116 having a single node 232, the apparatus and method of the present invention remains unchanged when a plurality of nodes are present.

Conventional transmission line theory is used to determine the distributed line properties of the coil 116 acting as an effective transmission line. When determining the distributed line properties of the coil 116, the effects of the plasma 123 are incorporated as a modified distributed impedance. Voltage and phase measurements are made at both the coil 116 input terminal 201 and the coil 116 output terminal 203 for varied RF powers. The voltage and phase measurements along with the terminating impedance (i.e., the impedance of capacitor 206) are used to determine the spatial distribution of the voltage corresponding to the standing RF wave along the length of the coil 116. A number of method can be used to determine the spatial distribution of the voltage along the length of the coil 116. An exemplary method for determining the spatial distribution of the voltage along the length of the coil 116 is found in a publication entitled "Observations of Standing Waves on an Inductive Plasma Coil Modeled as a Uniform Transmission Line", by Albert J. Lamm, Journal of Vacuum Science and Technology A15(5), 1997, pages 2615-2622. This article is herein incorporated by reference.

Figure 7:
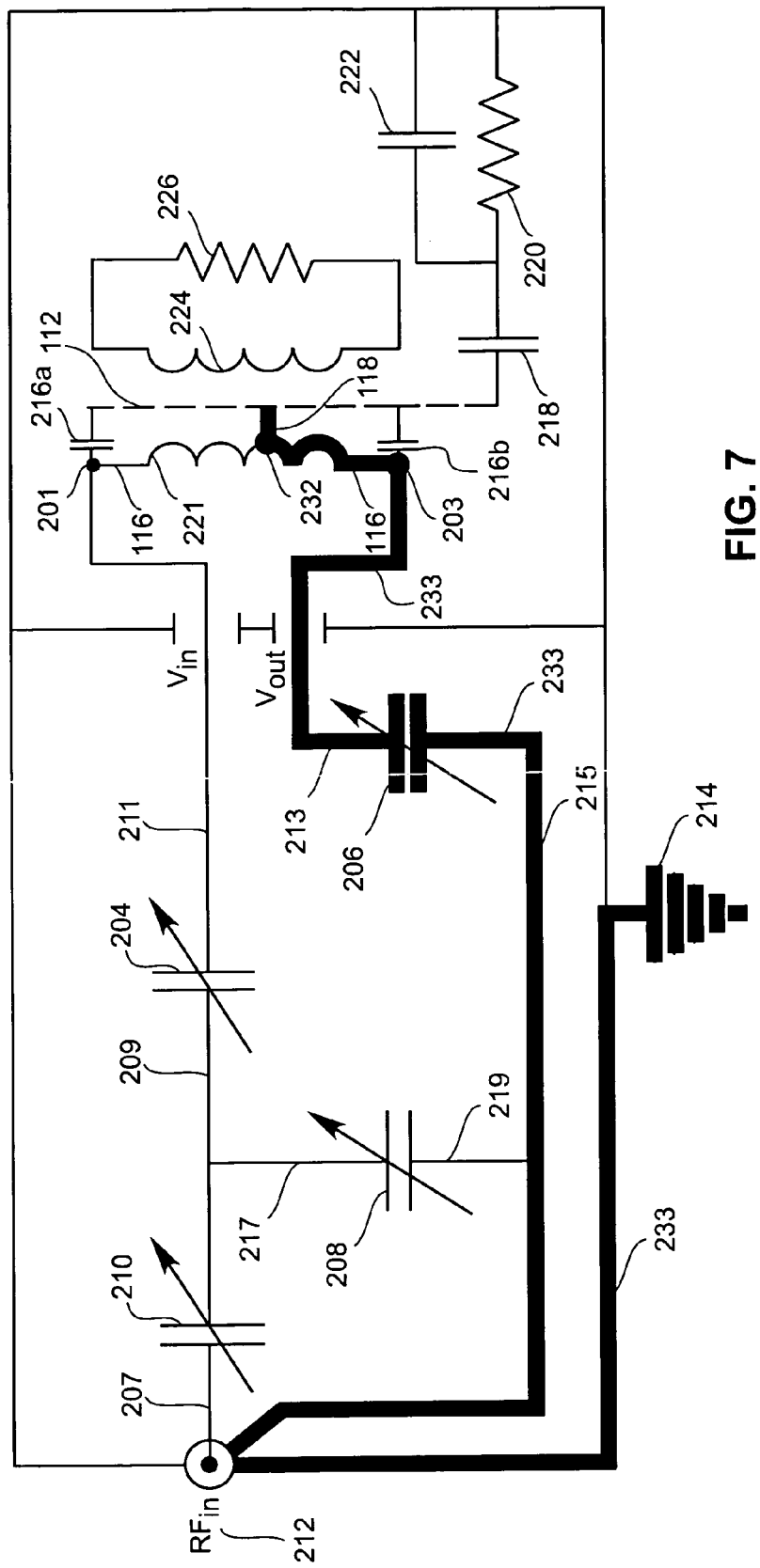
FIG. 7 is an illustration showing an electrical conduction path representing a virtual short that exists between the Faraday shield and the ground, in accordance with one embodiment of the present invention.

FIG. 7 shows an electrical conduction path representing a virtual short 233 that exists between the Faraday shield 112 and the ground 214, in accordance with one embodiment of the present invention. For the virtual short 233 to exist, the tap 118 should electrically connect the Faraday shield 112 to the coil 116 at a location substantially close to the node 232 of the standing RF wave along the length of the coil 116. By locating the tap 118 at the node 232, the capacitor 206 is made resonant with the standing RF wave along a conductive path defined through the coil 116 and tap 118 between the capacitor 206 and the Faraday shield 112. Since, the capacitor 206 is resonant with the standing RF wave, the capacitor 206 presents low impedance. Thus, the electrical conduction path between the Faraday shield 112 and the ground 214 through the capacitor 206 behaves as the virtual short 233.

With the tap 118 configured to connect to the coil 116 at the location of the node 232, the capacitor 206 can act as a tuning capacitor. A change in the capacitance of the tuning capacitor will result in a change in voltages $V_{in}$ and $V_{out}$ at the input terminal 201 and output terminal 203, respectively, of the coil 116. Anything that changes $V_{in}$ or $V_{out}$ will cause a change in the position of the node 232 on the standing RF wave along the length of the coil 116. Since the tap 118 location is physically fixed, a change in the node 232 location will cause the tap 118 to no longer be positioned at the node 232 location. Thus, with a change in capacitance of the tuning capacitor, the virtual short 233 existing between the Faraday shield 112 and the ground 214 will no longer exist and the voltage on the Faraday shield 112 will increase from zero.

The present invention takes advantage of the change in node 232 location corresponding to a change in capacitance of the tuning capacitor. Specifically, the capacitance of the tuning capacitor (i.e., capacitor 206) is changed (i.e., tuned) to move the node 232 location and cause a corresponding change in Faraday shield 112 voltage. As the node 232 location moves away from the tap 118 location, the voltage on the Faraday shield 112 increases. In a preferred embodiment, the tuning capacitor is a variable capacitor whose capacitance can be varied to control the Faraday shield voltage 112. As the capacitance of the tuning capacitor is either increased or decreased from the value at which the node 232 location corresponds to the tap 118 location, the voltage on the Faraday shield 112 increases. Thus, to maximize the range over which the Faraday shield 112 voltage can be increased, the tuning capacitor should be set substantially near its minimum capacitance value when the node 232 location is determined and the tap 118 is connected to the node 232 location. With this configuration, the capacitance of the tuning capacitor can be increased over a broad range with a corresponding increase in Faraday shield 112 voltage over a broad range. In a preferred embodiment, the tuning capacitor has a capacitance ranging from 20 pF to 500 pF. In an exemplary embodiment of the present invention, the Faraday shield 112 voltage can be adjusted from about 0 V to about 1200 V by adjusting the tuning capacitor over a range from 45 pF to 90 pF. The specific response of the Faraday shield 112 voltage to the adjustment of the tuning capacitor is dependent on the particular etching process and plasma 123 conditions. The ability to adjust the Faraday shield 112 voltage over a broad range corresponds to a higher likelihood that an appropriate voltage can be achieved to comply with the requirements of a particular etching process.

Figure 8:
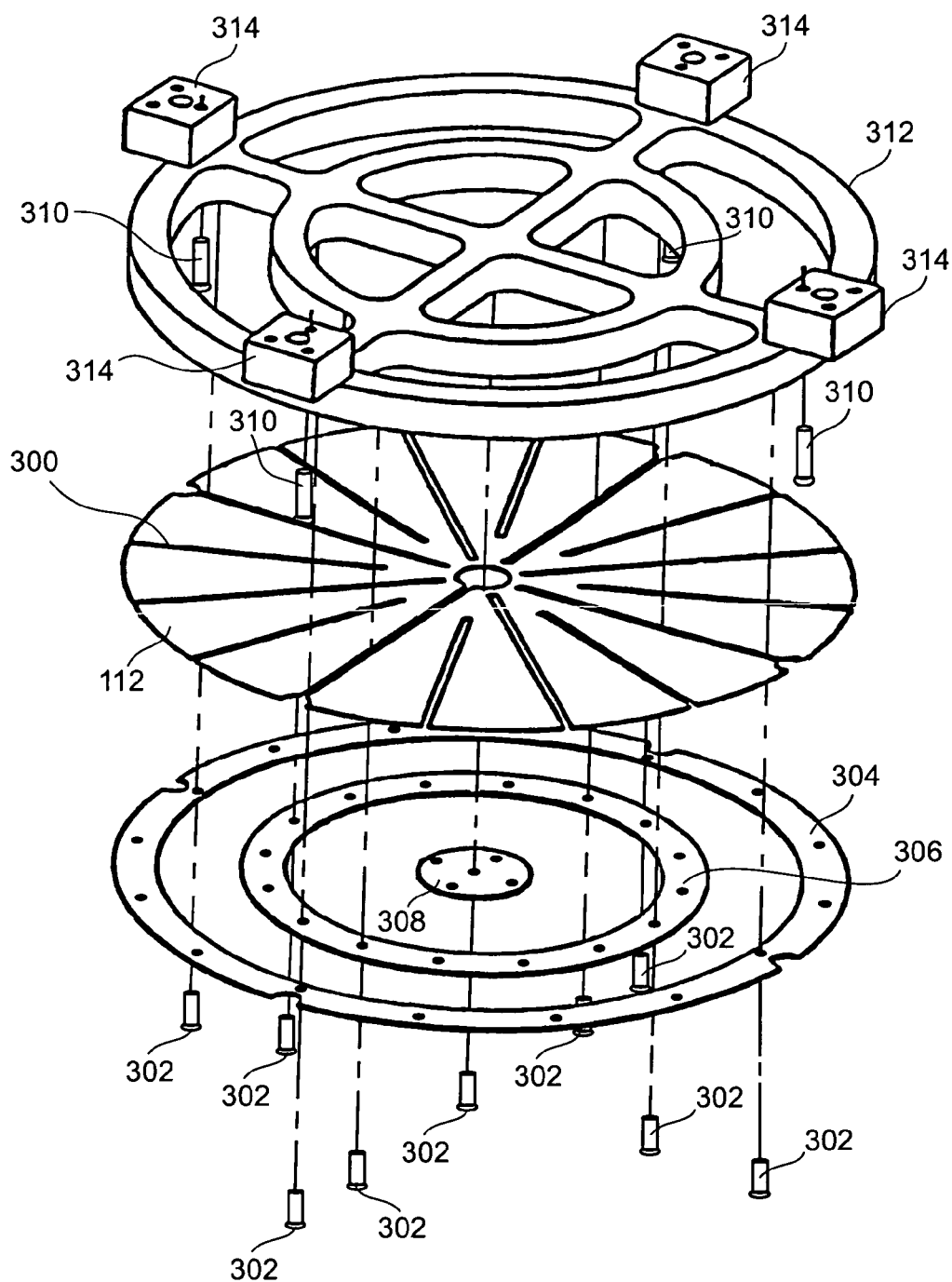
FIG. 8 is an illustration showing an exploded perspective view of the Faraday shield and components for holding the Faraday shield in place, in accordance with one embodiment of the present invention.

FIG. 8 shows an exploded perspective view of the Faraday shield 112 and components for holding the Faraday shield 112 in place, in accordance with one embodiment of the present invention. The Faraday shield 112 is secured by a plurality of screws 302 to the underside of an attachment frame 312, which is provided with a number of attachments spacers 314. The attachment spacers 314 are each secured to the topside of the attachment frame by a screw 310. The attachment frame 312, the attachment spacers 314, the screws 310, and the plurality of screws 302 may be formed of any suitable insulating material. A plurality of radial slots 300 are formed in the Faraday shield 112. The plurality of radial slots 300 interrupt a radial current flowing within the electrically conductive Faraday shield 112, wherein the radial current is induced by the current flowing on the coil 116. This is necessary because electric current flowing on the Faraday shield 112 will act to electrically shield the coil 116 and etching chamber 101 from each other. To retain the shape of the Faraday shield 112 in view of the plurality of radial slots 300, an outer ring 304, an inner ring 306, and a center disk 308 are secured to the attachment frame 312 by the plurality of screws 302. The outer ring 304, the inner ring 306, and the center disk 308 may be formed of any suitable insulating material. Alternate embodiments of the Faraday shield 112 may be used in combination with the present invention so long as the Faraday shield 112 in configured to function in a similar manner.

Figure 9:
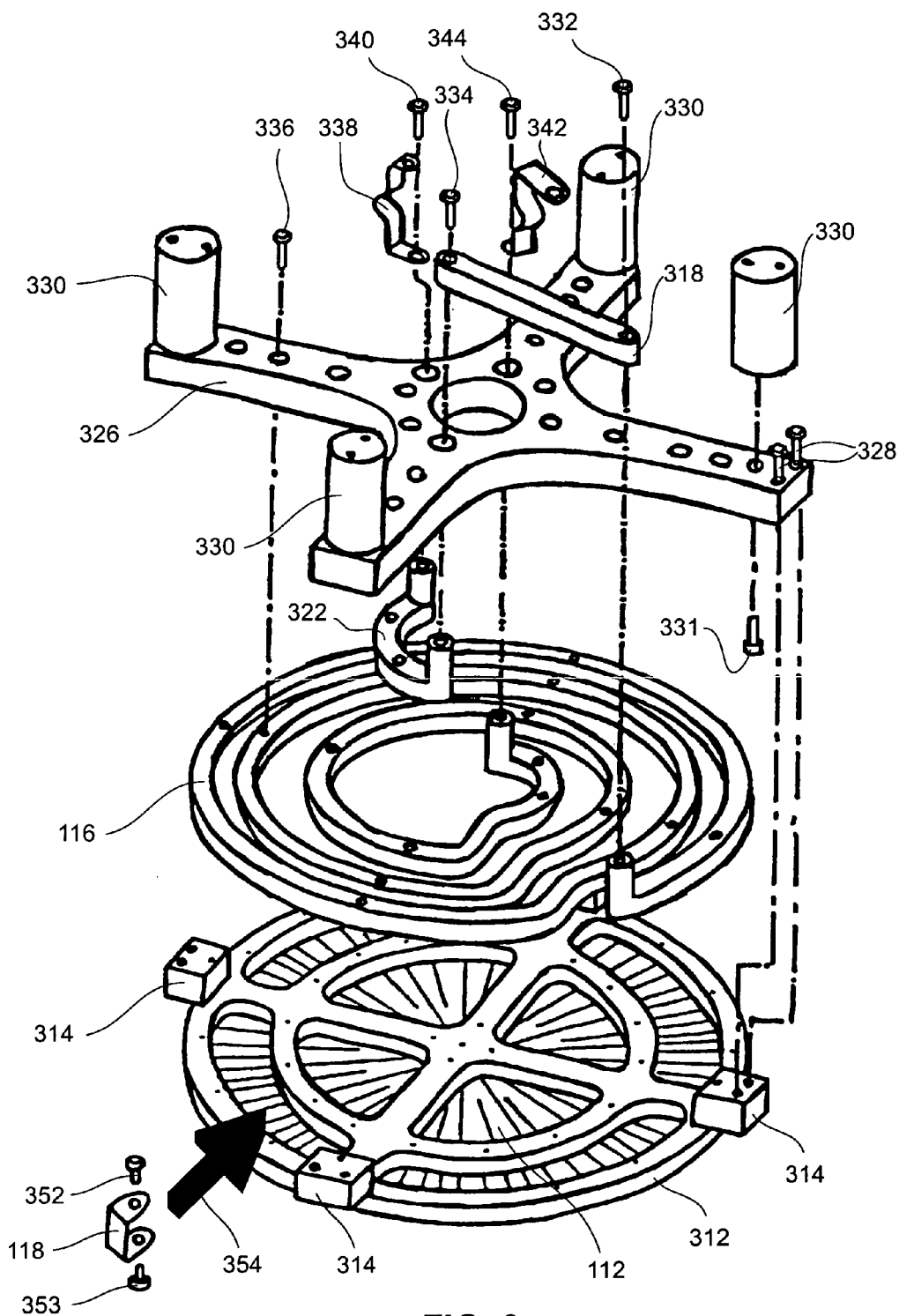
FIG. 9 is an illustration showing an exploded perspective view of the coil and components for holding the coil in place, in accordance with one embodiment of the present invention.

FIG. 9 shows an exploded perspective view of the coil 116 and components for holding the coil 116 in place, in accordance with one embodiment of the present invention. As previously shown in FIG. 8, the attachment frame 312 and attachment spacers 314 are provided between the Faraday shield 112 and the coil 116. Each of the four ends of a cross-shaped coil mounting plate 326 are secured to a support spring housing 330 by a screw 331. Each of the four ends of the cross-shaped coil mounting plate 326 are further secured to the attachment spacers 314 of the attachment frame 312 by screws 328. The coil 116 is fastened to the underside of the cross-shaped coil mounting plate 326 by a plurality of screws 336 (only one shown for clarity). In this configuration, the coil 116 is spaced apart from the Faraday shield 112 in a substantially parallel manner.

The tap 118 is connected to the coil 116 at a location substantially close to the node 232 location. Electrically speaking, the node 232 is a single point. Thus, it is not required that the tap be positioned exactly at the node 232 location. However, when the tap 118 is connected to the coil 116 at a location substantially close to the node 232 location, the node 232 can be moved by the adjusting the tuning capacitor to obtain the virtual short previously discussed. With these considerations, the tap 118 is inserted between the coil 116 and the Faraday shield 112 as indicated by arrow 354. In the exemplary embodiment shown in FIG. 9, the tap 118 is secured to the coil 116 by a screw 352 and to the Faraday shield 112 by a screw 353. In alternate embodiments, the tap 118 can be secured to the coil 116 and the Faraday shield 112 in other ways such that each connection is electrically conductive and immobile (e.g., molten metal solder, electrical welding, etc . . . ). Also, the tap 118 may be formed from any electrically conductive material. The tap 118 is the only electrically conductive connection between the coil 116 and the Faraday shield 112. In a preferred embodiment, the tap 118 connects the coil 116 to the Faraday shield 112 by traversing the shortest possible linear distance. In alternate embodiments, the tap 118 can be arbitrarily shaped to connect the coil 116 to the Faraday shield 112 by traversing distances other than the shortest possible linear distance.

FIG. 9 further shows a straight coil member 318 disposed across the topside of the cross-shaped coil mounting plate 326 and fastened to the coil 116 by a screw 332. A curved coil member 322 is disposed proximate to the coil 116 center on the underside of the cross-shaped coil mounting plate 326 and is fastened to the straight coil member 318 by a screw 334. An input terminal 338 is secured to the end of the curved coil member 322 by a screw 340. An output terminal 342 is secured to the end of the coil 116 opposite the input terminal 338 by a screw 344. Alternate embodiments of the coil 116 may be used in combination with the present invention so long as the coil 116 in configured to function in a similar manner.

Figure 10:
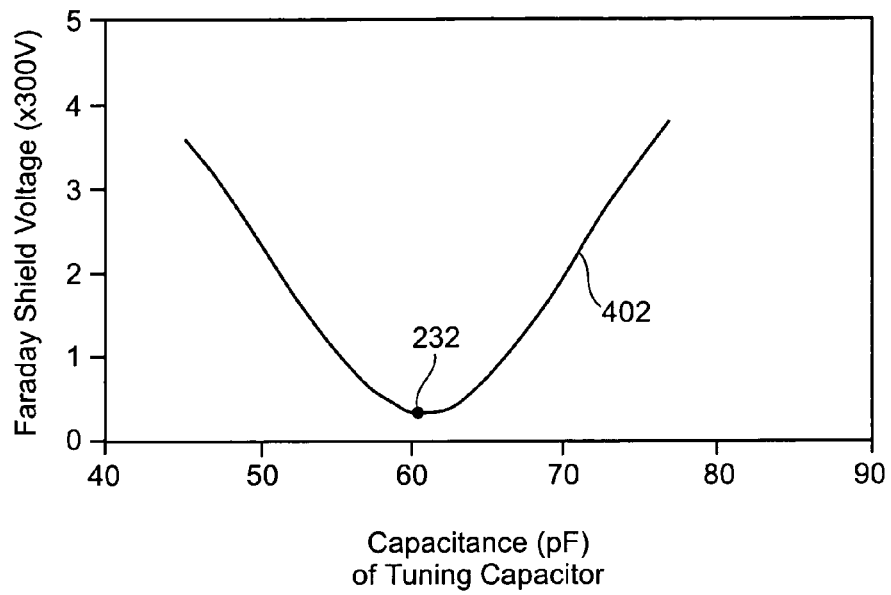
FIG. 10 is an illustration showing a graphical representation of experimental data obtained for the Faraday shield voltage response corresponding to adjustments of the tuning capacitor, in accordance with one exemplary embodiment of the present invention.

FIG. 10 shows a graphical representation of experimental data obtained for the Faraday shield 112 voltage response corresponding to adjustments of the tuning capacitor, in accordance with one exemplary embodiment of the present invention. Curve 402 illustrates an example of the wide range of voltage generated on the Faraday shield 112 in oxygen plasma 123 at 5 mT pressure and 1000 W RF power. In this example, the Faraday shield 112 voltage varies from substantially near 0 V to about 1200 V as the tuning capacitor is adjusted from about 60 pF to about 80 pF. The node 232 is obtained when the tuning capacitor is set near a capacitance of 61 pF. Note that the curve in FIG. 10 is based on a finite number of actual Faraday shield 112 voltage measurements. Hence, the curve as fitted to the actual measurement data does not quite reach the 0 V level at the node 232 as identified in FIG. 10. However, as previously discussed, adjustment of the tuning capacitor can be made to position the node 232 at the tap 118 location such that the corresponding Faraday shield 112 voltage is substantially near 0 V. Thus, precise adjustment of the tuning capacitor near a capacitance of 61 pF will locate the precise node position.

Figure 11:
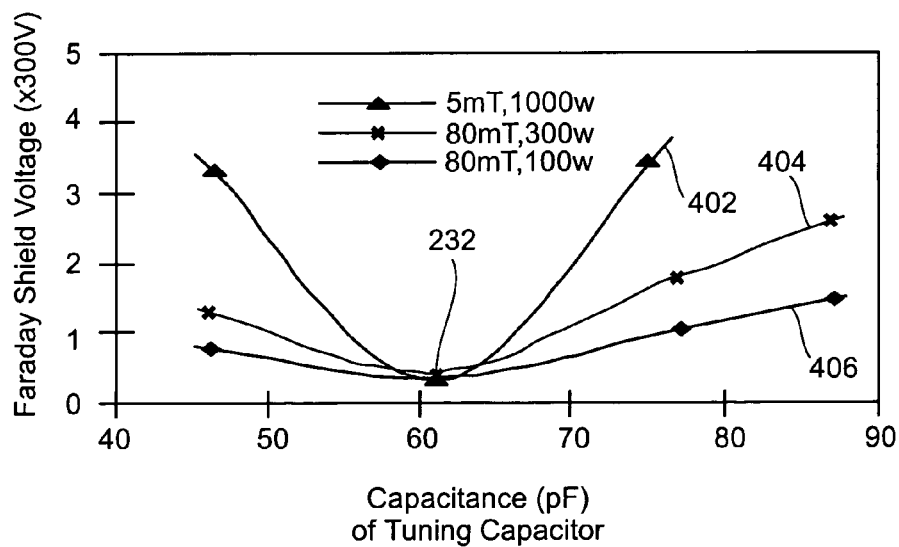
FIG. 11 is an illustration showing a graphical representation of experimental data obtained for the Faraday shield voltage response corresponding to adjustments of the tuning capacitor for various exemplary plasma conditions, in accordance with one exemplary embodiment of the present invention.

FIG. 11 shows a graphical representation of experimental data obtained for the Faraday shield 112 voltage response corresponding to adjustments of the tuning capacitor for various exemplary plasma 123 conditions, in accordance with one exemplary embodiment of the present invention. FIG. 11 illustrates examples of the range of voltage generated on the Faraday shield 112 in various oxygen plasma 123 conditions. Curve 402 corresponds to the oxygen plasma 123 at 5 mT pressure and 1000 W RF power as previously shown in FIG. 10. Curve 404 corresponds to the oxygen plasma 123 at 80 mT pressure and 300 W RF power. Curve 406 corresponds to the oxygen plasma 123 at 80 mT pressure and 100 W RF power. The node 232 is obtained when the tuning capacitor is set near a capacitance of 61 pF. Note that the node 232 position is independent of the plasma 123 condition. The independence of the node 232 position with respect to the plasma 123 condition allows the Faraday shield 112 voltage to be adjusted with the tuning capacitor without needing to relocate the tap 118 position or reconfigure the inductively coupled plasma etching apparatus 100. The examples of FIG. 11 are based on the use of oxygen as the reactant gas. However, the fundamentals and functionality of the present invention remain unchanged with the use of other appropriate reactant gases. As with FIG. 10, note that the curves in FIG. 11 are based on a finite number of actual Faraday shield 112 voltage measurements. Hence, the curves as fitted to the actual measurement data do not quite reach the 0 V level at the node 232 as identified in FIG. 11. However, as previously discussed, adjustment of the tuning capacitor can be made to position the node 232 at the tap 118 location such that the corresponding Faraday shield 112 voltage is substantially near 0 V. Thus, precise adjustment of the tuning capacitor near a capacitance of 61 pF will locate the precise node position.

Figure 12:
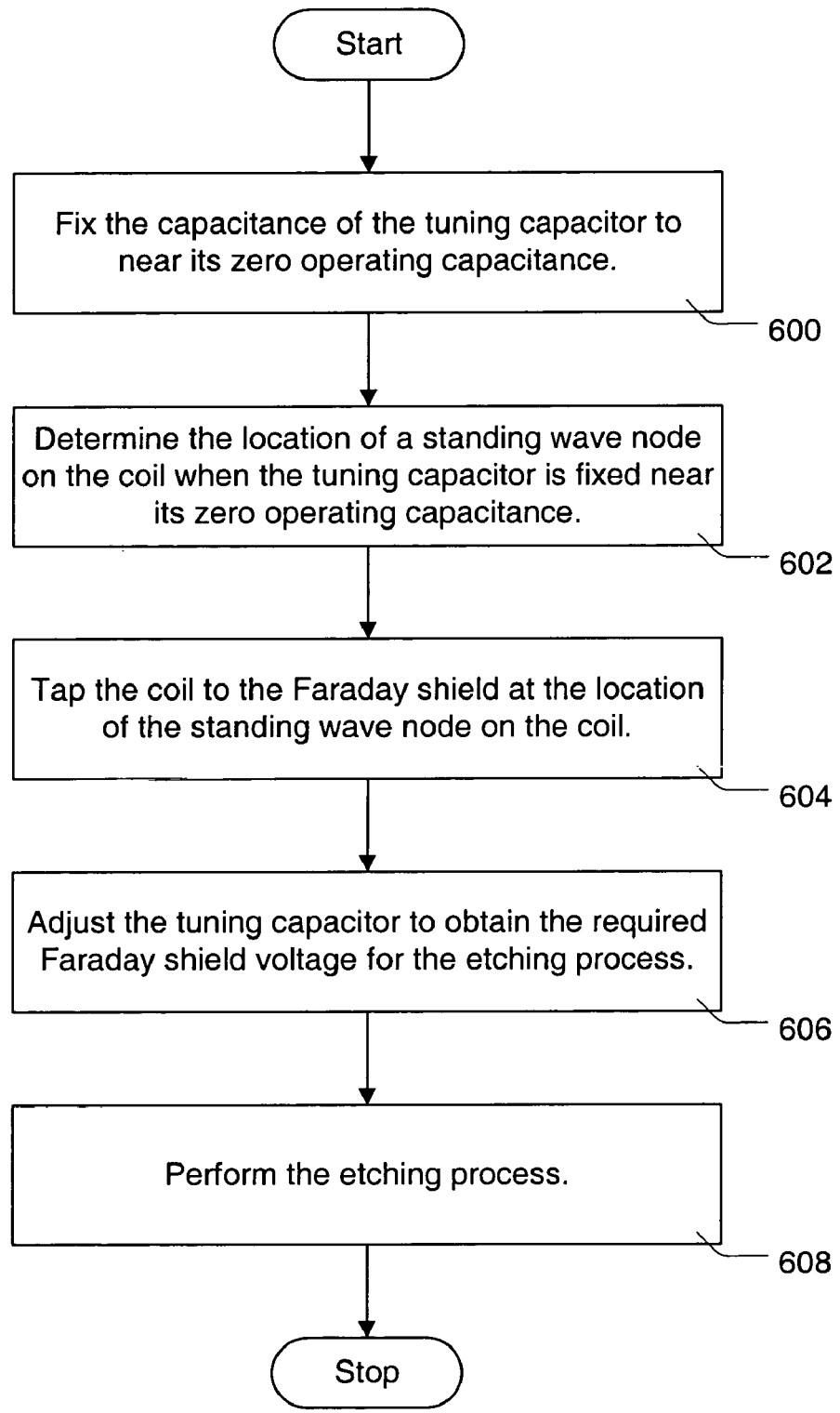
FIG. 12 is an illustration showing a flowchart of a method for adjusting the voltage on the Faraday shield of the inductively coupled plasma etching apparatus, in accordance with one embodiment of the present invention.

FIG. 12 shows a flowchart illustrating a method for adjusting the voltage on the Faraday shield 112 of the inductively coupled plasma etching apparatus 100, in accordance with one embodiment of the present invention. In the method, a step 600 includes fixing the capacitance of the tuning capacitor to near its zero operating capacitance. A step 602 of the method requires determining the location of the node 232 of the standing RF wave present on the coil 116. Step 602 is performed with the tuning capacitor fixed near its zero operating capacitance. A step 604 requires that the tap 118 electrically connecting the coil 116 to the Faraday shield 112 be connected to the coil 116 at a position substantially close to the location of the node 232 of the standing RF wave as determined in step 602. A step 606 requires that the tuning capacitor be adjusted to obtain a required Faraday shield 112 voltage for a particular etching process. A step 608 includes performing the particular etching process.

Figure 13:
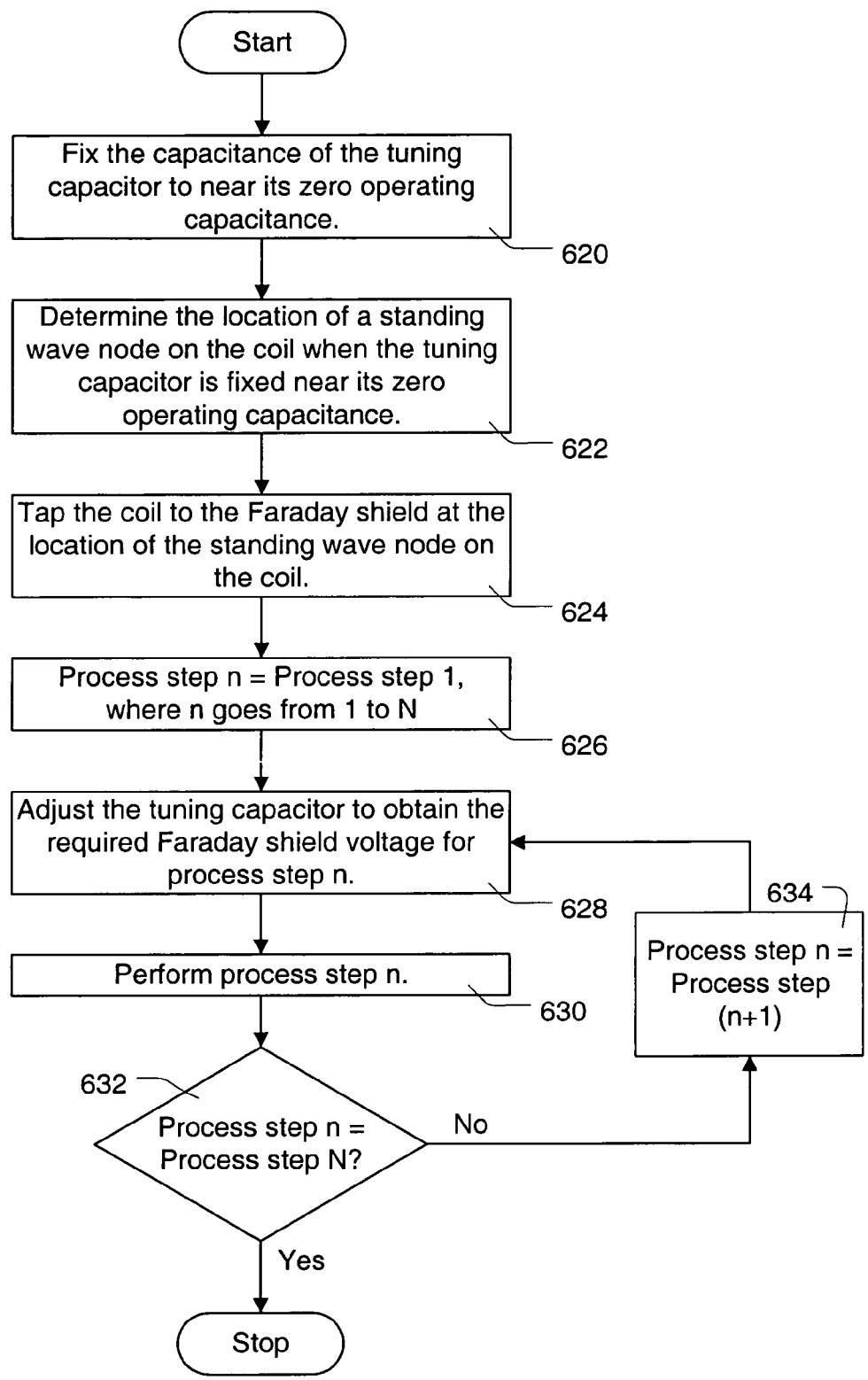
FIG. 13 is an illustration showing a flowchart of a method for adjusting the voltage on the Faraday shield of the inductively coupled plasma etching apparatus, in accordance with another embodiment of the present invention.

FIG. 13 shows a flowchart illustrating a method for adjusting the voltage on the Faraday shield 112 of the inductively coupled plasma etching apparatus 100, in accordance with another embodiment of the present invention. In the method, a step 620 includes fixing the capacitance of the tuning capacitor to near its zero operating capacitance. A step 622 requires determining the location of the node 232 of the standing RF wave present on the coil 116. Step 622 is performed with the tuning capacitor fixed near its zero operating capacitance. A step 624 requires that the tap 118 electrically connecting the coil 116 to the Faraday shield 112 be connected to the coil 116 at a position substantially close to the location of the node 232 of the standing RF wave as determined in step 622. A step 626 requires that the inductively coupled plasma etching apparatus 100 be prepared for a first etching step of a multiple step etching process. A step 628 requires that the tuning capacitor be adjusted to obtain a required Faraday shield 112 voltage for the current etching step of the multiple step etching process. A step 630 includes performing the current etching step. A decision step 632 queries whether the current etching step is the final step of the multiple step etching process. If the current etching step is not the final step, the method continues by performing a step 634 in which the next etching step of the multiple step etching process becomes the current etching step. The method then continues with step 628 wherein the tuning capacitor is adjusted to obtain the required Faraday shield 112 voltage for the current etching step. With regard to the decision step 632, if the current etching step is the final step, the multiple step etching process terminates.

Figure 14:
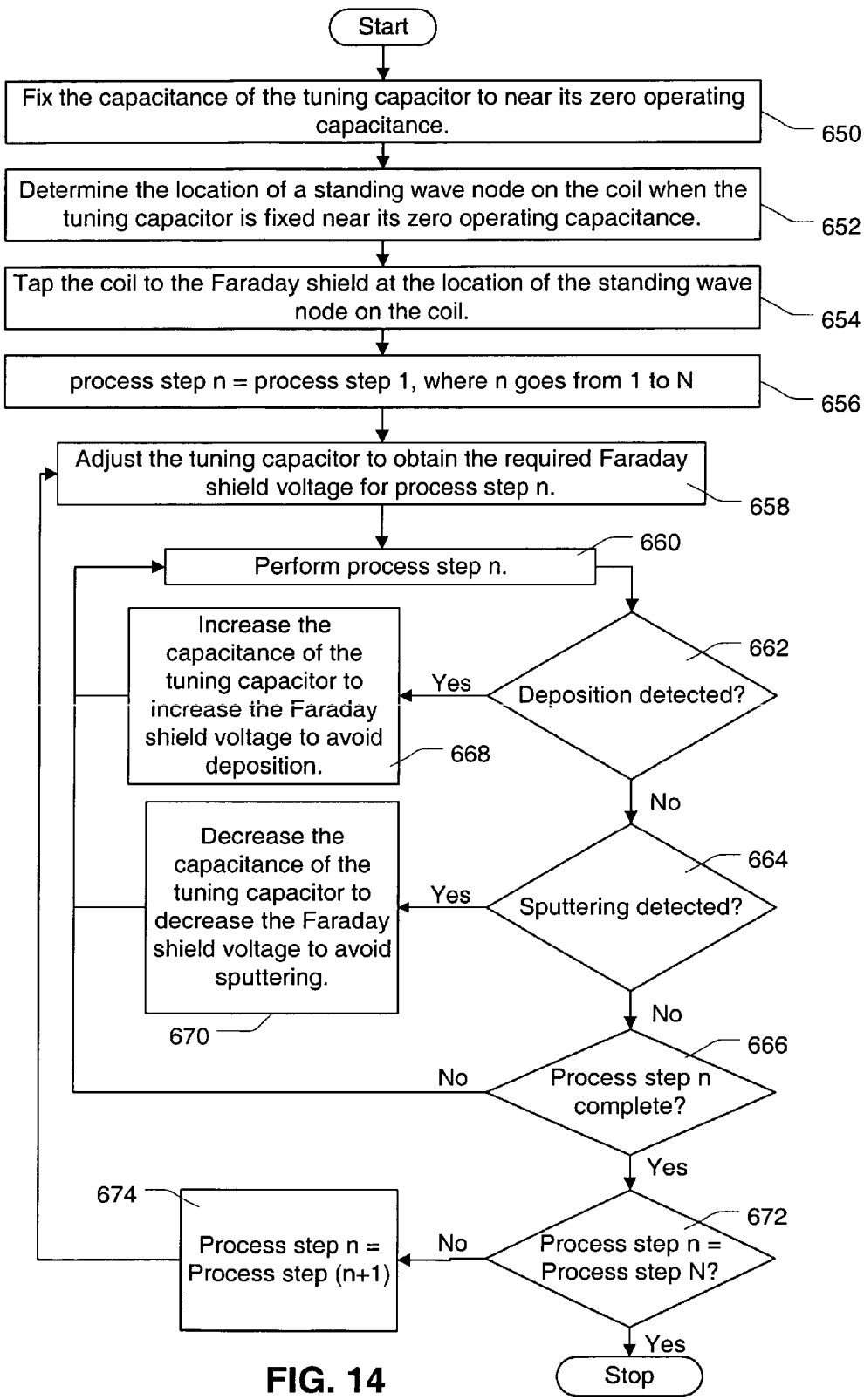
FIG. 14 is an illustration showing a flowchart of a method for adjusting the voltage on the Faraday shield of the inductively coupled plasma etching apparatus, in accordance with yet another embodiment of the present invention.

FIG. 14 shows a flowchart illustrating a method for adjusting the voltage on the Faraday shield 112 of the inductively coupled plasma etching apparatus 100, in accordance with yet another embodiment of the present invention. In the method, a step 650 includes fixing the capacitance of the tuning capacitor to near its zero operating capacitance. A step 652 requires determining the location of the node 232 of the standing RF wave present on the coil 116. Step 652 is performed with the tuning capacitor fixed near its zero operating capacitance. A step 654 requires that the tap 118 electrically connecting the coil 116 to the Faraday shield 112 be connected to the coil 116 at a position substantially close to the location of the node 232 of the standing RF wave as determined in step 652. A step 656 requires that the inductively coupled plasma etching apparatus 100 be prepared for a first etching step of a multiple step etching process. A step 658 requires that the tuning capacitor be adjusted to obtain a required Faraday shield 112 voltage for the current etching step of the multiple step etching process. A step 660 includes performing the current etching step.

During the performance of the current etching step, the chamber window 104 is monitored to detect the deposition of non-volatile etching by-product materials. Multiple techniques can be used to monitor and detect deposition of non-volatile etching by-product materials on the chamber window 104. One such example is optical reflectometry of thin films. The present invention also enables the use of a detected change in Faraday shield 112 voltage as a metric to detect deposition of non-volatile etching by-product materials. A decision step 662 represents the deposition monitoring. If deposition is detected, a step 668 is performed wherein the capacitance of the tuning capacitor is increased to increase the Faraday shield 112 voltage. The Faraday shield 112 voltage is increased to effect an increase in plasma 123 sputtering against the chamber window 104. The increase in plasma 123 sputtering against the chamber window 104 removes the detected deposition and prevents further deposition. The performance of the current etching step continues during and after the tuning capacitor adjustment of step 668.

Also during the performance of the current etching step, the chamber window 104 is monitored to detect excessive sputtering of plasma 123. A decision step 664 represents the plasma 123 sputter monitoring. If excessive sputtering is detected, a step 670 is performed wherein the capacitance of the tuning capacitor is decreased to decrease the Faraday shield 112 voltage. The Faraday shield 112 voltage is decreased to effect a decrease in plasma 123 sputtering against the chamber window 104. The decrease in plasma 123 sputtering against the chamber window 104 prevents erosion of the chamber window 104 material. Thus, preventing the introduction of unwanted chamber window 104 chemical species into the etching environment and improving the service lifetime of the chamber window 104. The performance of the current etching step continues during and after the tuning capacitor adjustment of step 670.

The current etching step continues until completed as indicated by a decision step 666. Upon completion of the current etching step, a decision step 672 queries whether the current etching step is the final step of the multiple step etching process. If the current etching step is not the final step, the method continues by performing a step 674 in which the next etching step of the multiple step etching process becomes the current etching step. The method then continues with step 658 wherein the tuning capacitor is adjusted to obtain the required Faraday shield 112 voltage for the current etching step. With regard to the decision step 672, if the current etching step is the final step, the multiple step etching process terminates.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for performing an inductively coupled plasma etching process, the process being performed in a chamber for etching a wafer, the chamber including a window on a top opening, the window having an outer surface and an inner surface that is exposed to an inner region of the chamber, a coil is positioned over the outer surface of the window and a metal shield is defined over the outer surface of the window, the metal shield being positioned in a spaced apart relationship between the coil and the outer surface of the window, the method comprising:
   connecting a tuning capacitor to the coil;
   determining a location of a node on the coil, the node corresponding to a node of a standing radio frequency wave existing on the coil;
   electrically connecting the coil to the metal shield at a connection location substantially close to the location of the node so as to make the timing capacitor resonant with the standing radio frequency wave existing on the coil;
   adjusting the tuning capacitor to obtain a required voltage on the metal shield, the required voltage being appropriate for an etching process; and
   performing the etching process.

2. A method for performing an inductively coupled plasma etching process as recited in claim 1, wherein the method further comprises:
   performing a plurality of etching process steps, the plurality of etching process steps each potentially requiring different voltages on the metal shield; and
   adjusting the tuning capacitor between etching process steps to obtain the required voltage on the metal shield, the required voltage being appropriate for a subsequent etching process step.

3. A method for performing an inductively coupled plasma etching process as recited in claim 2, wherein performing the plurality of etching process steps and adjusting the tuning capacitor between etching process steps are automatically performed according to a predetermined recipe.

4. A method for performing an inductively coupled plasma etching process as recited in claim 3, further comprising:
   monitoring the window inner surface to detect a deposition of an etching byproduct material, the monitoring being performed during each of the plurality of etching process steps; and
   automatically controlling the tuning capacitor to control the voltage on the metal shield, the controlled voltage on the metal shield preventing further deposition of the etching byproduct material on the window inner surface.

5. A method for performing an inductively coupled plasma etching process as recited in claim 4, further comprising:
   monitoring the window inner surface to detect a sputter, the monitoring being performed during each of the plurality of etching process steps; and
   automatically controlling the tuning capacitor to control the voltage on the metal shield, the controlled voltage on the metal shield preventing further sputter on the window inner surface.

6. A method for performing an inductively coupled plasma etching process as recited in claim 1, further comprising:
   monitoring the window inner surface to detect a deposition of an etching byproduct material, the monitoring being performed during the etching process; and automatically controlling the tuning capacitor to control the voltage on the metal shield, the controlled voltage on the metal shield preventing further deposition of the etching byproduct material on the window inner surface.

7. A method for performing an inductively coupled plasma etching process as recited in claim 1, further comprising:
monitoring the etching process to determine the adequacy of the voltage on the metal shield, the adequacy of the voltage being based on etching process requirements; and
adjusting the tuning capacitor to maintain an adequate voltage on the metal shield, the adequate voltage on the metal shield being sufficient to satisfy etching process requirements.

8. A method for performing an inductively coupled plasma etching process as recited in claim 1, further comprising:
monitoring the window inner surface to detect a sputter, the monitoring being performed during the etching process; and
automatically controlling the tuning capacitor to control the voltage on the metal shield, the controlled voltage on the metal shield preventing further sputter on the window inner surface.

9. A method for controlling deposition and sputtering during performance of an inductively coupled plasma etching process, comprising:
electrically connecting a tuning capacitor to the coil;
electrically connecting a metal shield to a coil at a location substantially close to a node of a standing radio frequency wave present on the coil so as to make the tuning capacitor resonant with the standing radio frequency wave present on the coil, wherein the metal shield is disposed between the coil and a window, the window being disposed over a region within which a plasma is to be generated by power emanating from the coil;
adjusting the tuning capacitor to obtain a required voltage on the metal shield for a particular etching process step;
performing the particular etching process step;
determining whether etching byproduct material has been adversely deposited on the window during performance of the particular etching process step;
increasing the capacitance of the tuning capacitor in response to determining that etching byproduct material has been adversely deposited on the window;
determining whether plasma has adversely sputtered on the window during performance of the particular etching process step;
decreasing the capacitance of the tuning capacitor in response to determining that plasma has adversely sputtered on the window; and
performing a subsequent etching process step.

10. A method as recited in claim 9, wherein increasing the capacitance of the tuning capacitor causes a voltage on the metal shield to increase, the increased voltage on the metal shield being sufficient to increase plasma sputtering such that etching byproduct material having been adversely deposited on the window is removed by the increased plasma sputtering.

11. A method as recited in claim 9, wherein decreasing the capacitance of the tuning capacitor causes a voltage on the metal shield to decrease, the decreased voltage on the metal shield being sufficient to decrease adverse plasma sputtering.

12. A method as recited in claim 9, further comprising:
monitoring a surface of the window exposed to the plasma to detect deposition of the etching byproduct material, the monitoring being performed during each of a plurality of etching process steps; and
automatically controlling the tuning capacitor to control the voltage on the metal shield, the controlled voltage on the metal shield preventing further etching byproduct deposition on the surface of the window exposed to the plasma.

13. A method as recited in claim 9, further comprising:
monitoring a surface of the window exposed to the plasma to detect sputtering of the plasma on the window, the monitoring being performed during each of a plurality of etching process steps; and
automatically controlling the tuning capacitor to control the voltage on the metal shield, the controlled voltage on the metal shield preventing further plasma sputtering on the surface of the window exposed to the plasma.

\* \* \* \* \*